(12) United States Patent
Prest et al.

(10) Patent No.: US 10,292,291 B2
(45) Date of Patent: *May 14, 2019

(54) COMPACT MEDIA PLAYER

(71) Applicant: Apple Inc., Cupertino, CA (US)

(72) Inventors: Christopher D. Prest, San Francisco, CA (US); Claudio Di Leo, Cambridge, MA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/937,723

(22) Filed: Mar. 27, 2018

(65) Prior Publication Data

US 2018/0220542 A1  Aug. 2, 2018

Related U.S. Application Data

(60) Continuation of application No. 14/271,340, filed on May 6, 2014, now Pat. No. 9,961,792, which is a
(Continued)

(51) Int. Cl.
*H05K 1/18* (2006.01)
*H05K 7/02* (2006.01)
(Continued)

(52) U.S. Cl.
CPC ............. *H05K 7/02* (2013.01); *G06F 1/1626* (2013.01); *H01L 23/3107* (2013.01);
(Continued)

(58) Field of Classification Search
CPC ....... H01L 2924/00; H01L 2224/32225; H01L 2224/16225; H01L 2224/48091;
(Continued)

(56) References Cited

U.S. PATENT DOCUMENTS 3,052,785 A   9/1962  Hermmann et al.
3,436,495 A   4/1969  Gorike
(Continued)

FOREIGN PATENT DOCUMENTS

CN   2372858     4/2000
CN   200966132  10/2007
(Continued)

OTHER PUBLICATIONS

"TRS connector" Wikipedia, [online], retrieved Jul. 28, 2008, <http://en.wikipedia.org/wiki/TRS_connector>—cited in P8179 and P6779.
(Continued)

*Primary Examiner* — Yuriy Semenenko
(74) *Attorney, Agent, or Firm* — Treyz Law Group, P.C.; G. Victor Treyz; Joseph F. Guihan

(57) ABSTRACT

An electronic device such as a media player is formed from electrical components such as integrated circuits, buttons, and a battery. Electrical input-output port contacts are used to play audio and to convey digital signals. Electrical components for the device are mounted to a substrate. The components are encapsulated in an encapsulant and covered with an optional housing structure. The electrical input-output port contacts and portions of components such as buttons remain uncovered by encapsulant during the encapsulation process. Integrated circuits are entirely encapsulated with encapsulant. The integrated circuits are packaged or unpackaged integrated circuit die. The substrate is a printed circuit board or is an integrated circuit to which components are directly connected without any printed circuit boards interposed between the integrated circuit and the components.

15 Claims, 16 Drawing Sheets

Related U.S. Application Data division of application No. 12/628,967, filed on Dec. 1, 2009, now Pat. No. 8,724,339.

(51) Int. Cl.
  *G06F 1/16* (2006.01)
  *H01L 23/31* (2006.01)

(52) U.S. Cl.
  CPC ........... *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/09701* (2013.01); *H01L 2924/1305* (2013.01); *H01L 2924/19041* (2013.01); *H01L 2924/19107* (2013.01); *Y10T 29/49146* (2015.01)

(58) Field of Classification Search
  CPC . H01L 2224/48227; H01L 2224/73204; H01L 2224/73265; H01L 2924/1305; H01L 2924/00014; H01L 23/3107; H01L 2924/09701
  See application file for complete search history.

(56) References Cited

U.S. PATENT DOCUMENTS

| | | | |
|---|---|---|---|
| 4,479,112 A | 10/1984 | Hirsch | |
| 5,323,150 A | 6/1994 | Tuttle | |
| 5,612,513 A * | 3/1997 | Tuttle | H01L 23/24 174/260 |
| RE35,536 E | 6/1997 | Irissou et al. | |
| 5,649,307 A | 7/1997 | Patino | |
| 5,701,355 A | 12/1997 | Brannan et al. | |
| RE35,765 E | 4/1998 | Tuttle | |
| 5,898,147 A | 4/1999 | Domzalski et al. | |
| 5,907,477 A | 5/1999 | Tuttle et al. | |
| 6,122,369 A | 9/2000 | Hwang et al. | |
| 6,271,487 B1 | 8/2001 | Domzalski et al. | |
| 6,375,780 B1 | 4/2002 | Tuttle et al. | |
| 6,547,130 B1 | 4/2003 | Shen | |
| 6,745,014 B1 | 6/2004 | Seibert et al. | |
| 6,813,147 B2 * | 11/2004 | Jeong | G11B 25/043 360/99.01 |
| 6,988,905 B2 | 1/2006 | Corey et al. | |
| 7,091,899 B2 * | 8/2006 | Imamura | G08C 17/00 320/135 |
| 7,103,684 B2 | 9/2006 | Chen et al. | |
| 7,110,799 B1 | 9/2006 | Willins et al. | |
| 7,166,910 B2 | 1/2007 | Minervini | |
| 7,232,957 B2 | 7/2007 | Mizutani et al. | |
| 7,257,714 B1 | 8/2007 | Shen | |
| 7,286,887 B2 | 10/2007 | Lapstun | |
| 7,349,546 B2 | 3/2008 | Ganton | |
| 7,400,937 B2 | 7/2008 | Lapstun | |
| 9,961,792 B2 * | 5/2018 | Prest | G06F 1/1626 |
| 2001/0053228 A1 | 12/2001 | Jones | |
| 2002/0079568 A1 | 6/2002 | Degani et al. | |
| 2003/0198355 A1 | 10/2003 | Hong | |
| 2004/0106231 A1 | 6/2004 | Wang | |
| 2005/0067186 A1 | 3/2005 | Mizutani et al. | |
| 2005/0201568 A1 | 9/2005 | Goyal | |
| 2005/0217986 A1 * | 10/2005 | Nam | H01H 13/7006 200/516 |
| 2005/0268314 A1 * | 12/2005 | Dai | G11B 17/0405 720/657 |
| 2005/0272401 A1 | 12/2005 | Zatezalo et al. | |
| 2005/0280139 A1 * | 12/2005 | Zhao | H01L 23/24 257/704 |
| 2006/0009868 A1 | 1/2006 | Park | |
| 2006/0070449 A1 | 4/2006 | Yokoyama et al. | |
| 2006/0181154 A1 | 8/2006 | Ratner et al. | |
| 2006/0278503 A1 | 12/2006 | Jorge | |
| 2007/0004472 A1 | 1/2007 | Gitzinger | |
| 2007/0049103 A1 | 3/2007 | Kashi | |
| 2007/0066102 A1 | 3/2007 | Takemoto et al. | |
| 2007/0178622 A1 | 8/2007 | Liu et al. | |
| 2007/0178947 A1 | 8/2007 | Kim | |
| 2007/0225049 A1 | 9/2007 | Andrada | |
| 2007/0228509 A1 | 10/2007 | Okada et al. | |
| 2008/0013274 A1 * | 1/2008 | Jobs | G06F 1/1616 361/679.4 |
| 2008/0032753 A1 | 2/2008 | Nho | |
| 2008/0039072 A1 | 2/2008 | Bloebaum | |
| 2008/0062153 A1 | 3/2008 | Moolsintong et al. | |
| 2008/0065246 A1 * | 3/2008 | Zorkendorfer | G06F 1/163 700/94 |
| 2008/0164994 A1 | 7/2008 | Johnson et al. | |
| 2008/0166003 A1 | 7/2008 | Hankey et al. | |
| 2008/0181573 A1 * | 7/2008 | Lampert | G06F 1/1626 386/358 |
| 2008/0197479 A1 | 8/2008 | Kim et al. | |
| 2009/0174462 A1 | 7/2009 | Bronstein et al. | |
| 2009/0179768 A1 | 7/2009 | Sander et al. | |
| 2009/0294792 A1 * | 12/2009 | Lee | G06K 19/07745 257/99 |
| 2010/0054493 A1 | 3/2010 | Lin et al. | |
| 2010/0062617 A1 | 3/2010 | Bang et al. | |
| 2011/0194710 A1 | 8/2011 | Prest et al. | |
| 2013/0183862 A1 * | 7/2013 | Ni | H01R 12/71 439/620.22 |
| 2013/0271932 A1 * | 10/2013 | Zhao | G11B 33/022 361/752 |
| 2018/0192530 A1 * | 7/2018 | Wang | H01Q 1/243 |

FOREIGN PATENT DOCUMENTS

| | | |
|---|---|---|
| CN | 201018635 | 2/2008 |
| EP | 1 542 250 | 6/2005 |
| EP | 1 986 205 | 10/2008 |
| JP | H11-126126 | 5/1999 |
| JP | 2005-183925 | 7/2005 |
| JP | 2006126182 | 5/2006 |
| JP | 2007-109198 | 4/2007 |
| KR | 10-0851048 | 8/2008 |
| TW | 1273467 | 2/2007 |
| TW | 200908275 | 2/2009 |
| WO | 1999057937 | 11/1999 |
| WO | 2002/45463 | 6/2002 |
| WO | 2003056790 | 7/2003 |
| WO | 2007148163 | 12/2007 |
| WO | 2008085915 | 7/2008 |
| WO | 2008085929 | 7/2008 |

OTHER PUBLICATIONS

"PICO USB Drives", [online], Super Talent Electronics, Inc., [retrieved on Dec. 1, 2009], <URL: http://supertalent.com/datasheets/18_75.pdf>.

"IC Package", [online], Fujitsu Microelectronics Limited, [retrieved on Dec. 1, 2009], <URL: http://www.fujitsu.com/downloads/EDG/binary/pdf/catalogs/a810000112e.pdf>.

\* cited by examiner

COMPACT MEDIA PLAYER

This application is a continuation of patent application Ser. No. 14/271,340, filed May 6, 2014, which is a division of patent application Ser. No. 12/628,967, filed Dec. 1, 2009, now U.S. Pat. No. 8,724,339, which are both hereby incorporated by reference herein in their entireties. This application claims the benefit of and claims priority to patent application Ser. No. 14/271,340, filed May 6, 2014, and patent application Ser. No. 12/628,967, filed Dec. 1, 2009, now U.S. Pat. No. 8,724,339.

BACKGROUND

This relates generally to electronic devices and, more particularly, to compact device constructions for electronic devices such as media players and media player accessories.

Electronic devices such as media players are often used in applications in which excessive size and weight is not desirable. For example, many users of media players listen to music while exercising or traveling. In situations such as these, it can be highly desirable to minimize the bulk of a media player.

In conventional media player designs, packaged integrated circuits and other components are mounted on a printed circuit board. The printed circuit board is mounted within a device housing using brackets and other mounting hardware. Conventional designs of this type are sufficiently durable to withstand normal handling, but can sometimes be more bulky than desired.

It would therefore be desirable to be able to provide compact arrangements for media players and other electronic devices.

SUMMARY

An electronic device such as a media player may be formed from electrical components such as integrated circuits, buttons, and a battery. A small form factor device may be implemented by eliminating some or all of the housing structures of traditional devices and component mounting structures.

With one suitable arrangement, an integrated circuit die is used as a substrate. Electrical components may be mounted directly to the integrated circuit die. With another suitable arrangement, a printed circuit board may serve as a mounting substrate. Packaged and unpackaged integrated circuit die and other electrical components may be mounted to the printed circuit board.

The electronic device may have input-output port electrical contacts. These contacts ma be used, for example, to play audio through an attached accessory or to convey digital signals to and from an attached computer.

During fabrication, the electrical components that are mounted to the substrate may be encapsulated in an encapsulant. The encapsulant may be formed from a dielectric such as epoxy, plastic, or other materials. When the encapsulant cures, the encapsulated electrical components are sealed off from the environment and are therefore not adversely affected by changes in humidity and other environmental factors.

A housing, such as a thin metal housing may be used to cover some or all of the encapsulant. Few or no gaps need be provided between the encapsulant and the walls of the housing.

During component encapsulation, the integrated circuits and other components such as discrete components may be entirely surrounded by encapsulant. Other structures such as portions of buttons and the electrical input-output port contacts may be left uncovered by the encapsulant.

Further features of the invention, its nature and various advantages will be more apparent from the accompanying drawings and the detailed description of the preferred embodiments.

DETAILED DESCRIPTION

Figure 1:
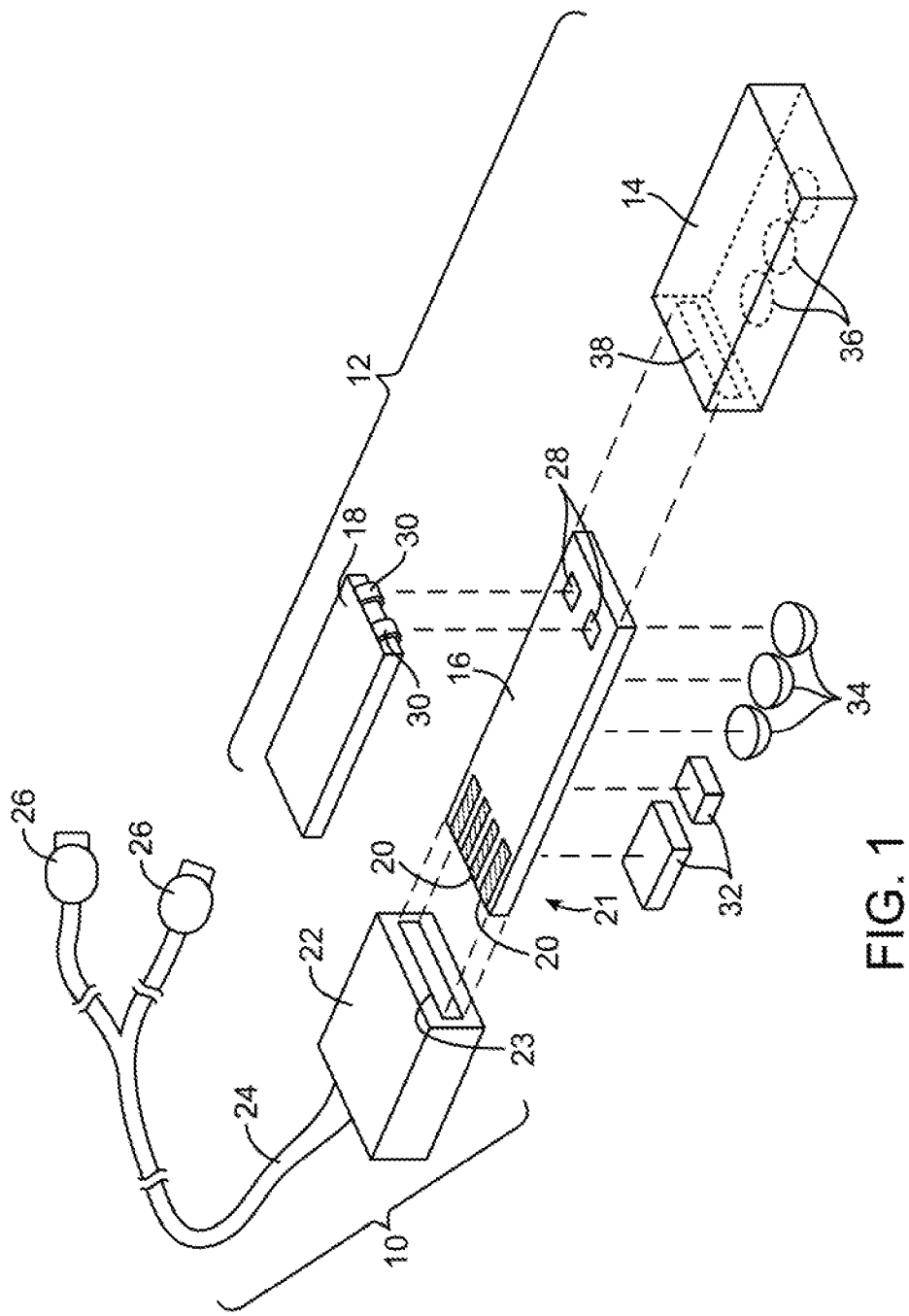
FIG. 1 is an exploded perspective view of an illustrative electronic device such as a media player and a mating accessory such as a headset in accordance with an embodiment of the present invention.

An electronic device and a corresponding accessory are shown in FIG. 1. Accessory 10 may be a headset or other electronic equipment. Electronic device 12 may be a media player or other electronic equipment. For clarity, arrangements in which electronic device 12 is a media player and in which accessory 10 is a pair of earbuds or other headphones are sometimes described herein as an example. This is, however, merely illustrative. Device 12 and accessory 10 may be any suitable electronic equipment.

The exploded perspective view of FIG. 1 shows illustrative components of electronic device 12. In some configurations of device 12 that are described herein, some or all of the components for device 12 are mounted directly on an integrated circuit die to save space. In this type of configuration, the die itself serves as a mounting substrate. Encapsulant and an optional housing shell may then be used to encase the mounted components. If desired, other substrates may be used for mounting components. For example, integrated circuits and discrete components may be mounted on a plastic support structure that is covered with conductive traces. In the example of FIG. 1, device 1 is formed using a substrate such as printed circuit board 16. Printed circuit board 16 may be formed from a rigid printed circuit board material (e.g. fiberglass-filled epoxy) or flexible printed circuit board material (e.g., a polymer sheet such as a layer of polyimide).

Components such as components 32, buttons 34, and battery 18 may be electrically connected to printed circuit board 16. For example, battery 18 may have battery terminals 30 that are electrically connected to battery contacts 28. Traces on one or both sides of printed circuit board 16 may mate with corresponding electrical contacts on components such as components 32, buttons 34, etc.

Some or all of printed circuit board 16 may be coated with encapsulant (e.g., all or at least some of both the upper and lower sides of board 16 may be encapsulated). The encapsulant may be covered by an optional housing such as housing 14. Housing 14 may, for example, have an opening such as opening 38 into which printed circuit board 16 and the encapsulant surrounding printed circuit board 16 may be inserted. If desired, printed circuit board 16 may be inserted into the interior of housing 14 and encapsulant may be injected into the gaps between printed circuit board 16 and the inner walls of housing 14. Housing 14 may have holes such as holes 36 to accommodate buttons 34.

Any suitable encapsulant may be used to encapsulate the circuitry of device 12. For example, the circuitry of device 12 may be encapsulated using a dielectric such as epoxy. Other suitable materials that may be used as encapsulant include foam, silicone, plastic, glass, adhesive, combinations of these materials, etc. The encapsulant that is used to encase the circuitry of device 12 may form a rigid structure that helps adhere components to printed circuit board 16 or otherwise hold components in place. The encapsulant that is used may also help to block moisture and thereby prevent changes in humidity or other environmental factors from affecting the performance of the circuitry. Epoxy may be cured using thermal curing or ultraviolet light curing techniques. Thermoplastic encapsulants may be injection molded using an injection molding tool and hardened by cooling. In general, these curing techniques or other suitable techniques may be used in curing and hardening encapsulant.

One or more input-output ports may be formed in device 12. For example, an input-output port may be formed by one or more electrical contacts such as electrical input-output port contacts 20. Contacts 20 may be formed from traces of copper, copper plated with gold, or other conductive materials. There may be any suitable number of contacts (e.g., two, three, four or more, etc.). As shown in FIG. 1, contacts 20 may be formed on end portion 21 of device 12. When printed circuit board 16 is inserted into housing 14, end portion 21 may protrude out of hole 38. This allows end portion 21 and contacts 20 to be inserted into hole 23 in accessory connector 22.

Connector 22 may have contacts that mate with contacts 20 and that are coupled to wires in cable 24. Cable 24 may be connected to components in accessory 10 such as speakers 26, buttons, etc.

If desired, contacts 20 may have the shape and layout of contacts in a Universal Serial Bus (USB) plug. This allows end 21 to serve as a USB plug when plugging into a USB jack on a portable or desktop computer (as an example). A USB plug has power and ground pins and a pair of digital data pins. When plugged into connector 22, the circuitry of device 12 can be reconfigured so that the digital data pins and the ground power pin operate as analog audio output pins for left and right audio. The positive power pin may or may not be used when device 12 is connected to accessory 10, depending on whether or not the accessory contains circuitry that uses a power supply voltage supplied by battery 18.

Components 32 may include packaged or unpackaged integrated circuits (i.e., packaged or unpackaged integrated circuit die), discrete components such as resistors, inductors, and capacitors (e.g., surface-mount technology components), components such as switches (see, e.g., switches 34), connector port components (e.g., USB connectors or other port connectors), etc.

Figure 2:
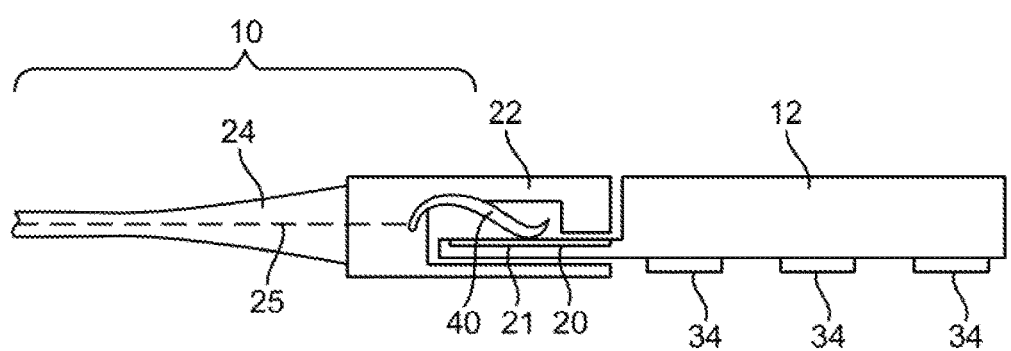
FIG. 2 is a cross-sectional side view of an electronic device and accessory of the type shown in FIG. 1 in accordance with an embodiment of the present invention.

A cross-sectional side view of device 12 when mated with connector 22 of accessory 10 is shown in FIG. 2. As shown in FIG. 2, when end 21 of device 12 is plugged into connector 22, contact structures such as conductive metal prongs 40 make contact with corresponding contacts 20 in device 12. Prongs 40 may be connected to electrical paths such as wires 25 using solder, welds, conductive adhesive, or crimp connections. Wires 25 may be connected to headphone speakers (i.e., earbud drivers).

Figure 3:
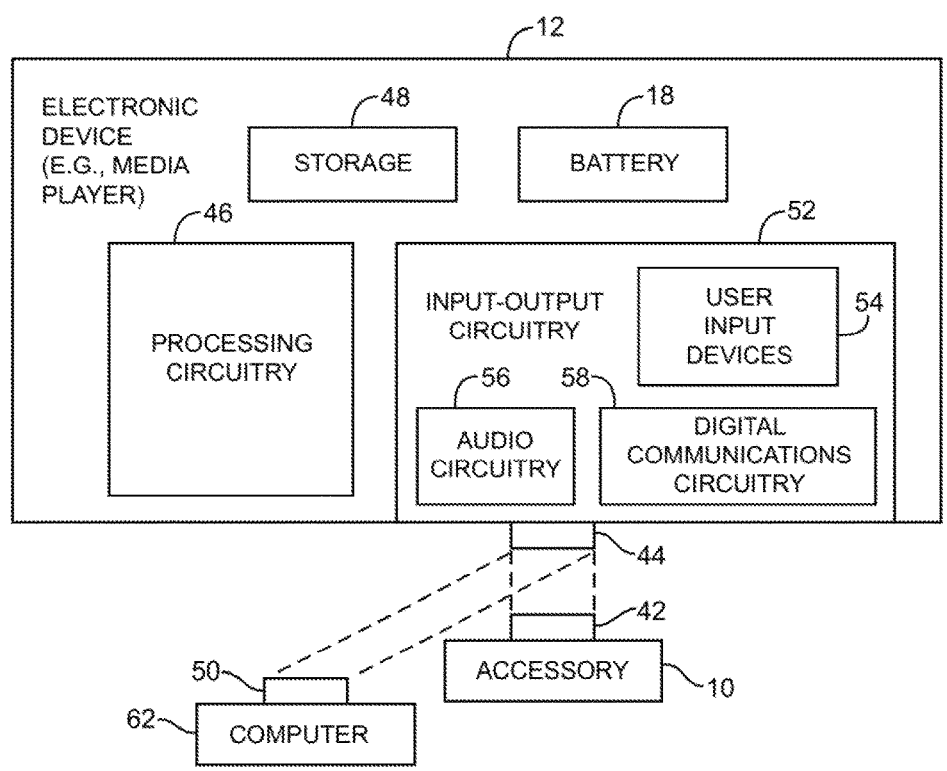
FIG. 3 is a schematic circuit diagram of an electronic device such as a media player and a corresponding accessory in accordance with an embodiment of the present invention.

A schematic circuit diagram of illustrative circuitry that may be used in device 12 is shown in FIG. 3. As shown in FIG. 3, device 12 may have storage 48 and processing circuitry 46. Storage 48 may include volatile and nonvolatile memory (e.g., random-access memory, flash memory, solid state drives, hard drives, removable media, etc.). Processing circuitry 46 may be based on one or more microprocessors, microcontrollers, digital signal processors, application-specific integrated circuits, etc. Storage 48 may be used to store software code such as code that implements device functions for device 12. Storage 48 may also be used to store media (e.g., song files, video files, etc.). During operation, processing circuitry 46 can run code such as the code that is stored in storage 48. Using the general purpose resources of processing circuitry 46 and, if desired, dedicated hardwired resources in device 12, processing circuitry 46 can implement functions such as media playback functions, user input-output command processing functions, etc.

Input-output circuitry 52 may be used to supply output to a user of device 12. Input-output circuitry 52 may, for example, include output devices such as speakers, status indicator lights, buzzers, actuators to create vibrations, displays, etc. Input-output circuitry 52 may include audio circuitry 56 to supply audio output signals (e.g., analog right and left audio signals for corresponding right and left speakers in accessory 10 of FIG. 1). Digital communications circuitry 58 may be used to support bidirectional communications over port 44. Port 44 may include contacts 20 (FIGS. 1 and 2) that mate with corresponding contacts in port 42 of accessory 10 or port 50 of computer 62 or other external equipment. Port 50 may be, for example, a USB port on a desktop or laptop computer (computer 62). Port 42 may be based on a connector such as connector 22 of FIG. 1. User input devices 54 may include touch screen displays, buttons, microphones, slider-type and rocker-type switches. Input-output ports in circuitry 52 such as input-output port 44 may be used to receive and transmit analog and digital signals with external equipment using input-output circuits such as circuitry 56 and circuitry 58.

In a typical usage scenario, a user may initially plug device 12 into computer 62 to download media files from computer 62 to storage 48. In this configuration, port 44 mates with port 50. Switching circuitry in input-output circuitry 52 may be adjusted to connect digital communications circuitry 58 (e.g., USB communications circuitry) to the data terminals in contacts 20, so that circuitry 58 may be used to receive digital data from computer 62. Power lines may also be routed to the power contacts in contacts 20. The received digital information may be stored in storage 48 for later use.

After downloading desired files, a user may connect device 12 to accessory 10. In this configuration, port 44 mates with port 42. The switching circuitry in input-output circuitry 52 may be readjusted to connect audio circuitry 56 to the data terminals (and ground terminal) in contacts 20 of port 44 in place of digital communications circuitry 58. If it is desired to route power to accessory 10 from battery 18, the positive power terminal in contacts 20 may be connected to the mating connector in port 42. If this type of power supply voltage is not needed by accessory 10, the positive power supply terminal in contacts 20 can be grounded or left floating.

Figure 4A:
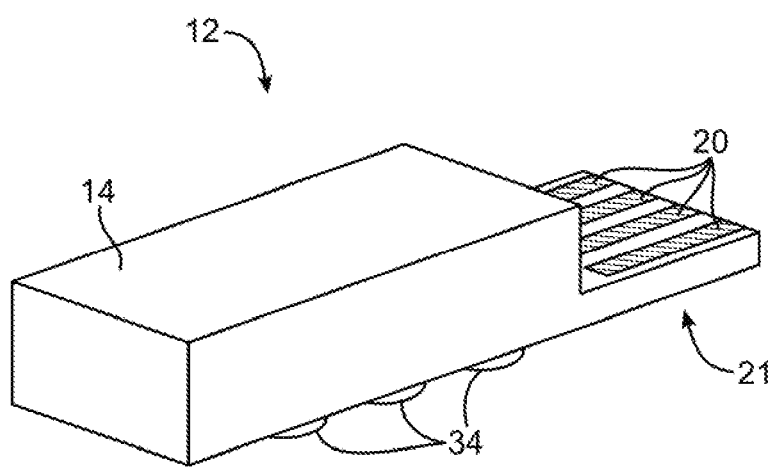
FIG. 4A is a bottom perspective view of an illustrative electronic device in accordance with an embodiment of the present invention.
Figure 4B:
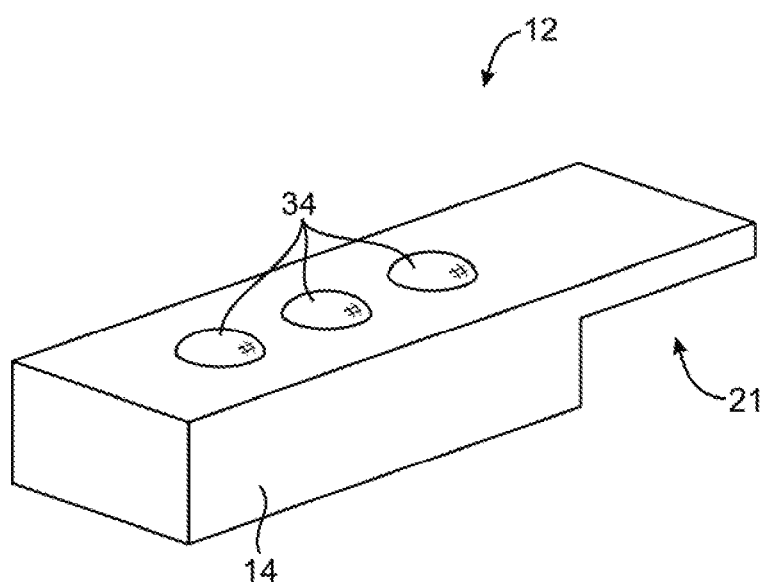
FIG. 4B is a top perspective view of the illustrative electronic device of FIG. 4A in accordance with an embodiment of the present invention.

FIG. 4A is a bottom perspective view of an electronic device such as electronic device 12 of FIG. 1. FIG. 4B is a top perspective view of device 12 of FIG. 4A.

Figure 5:
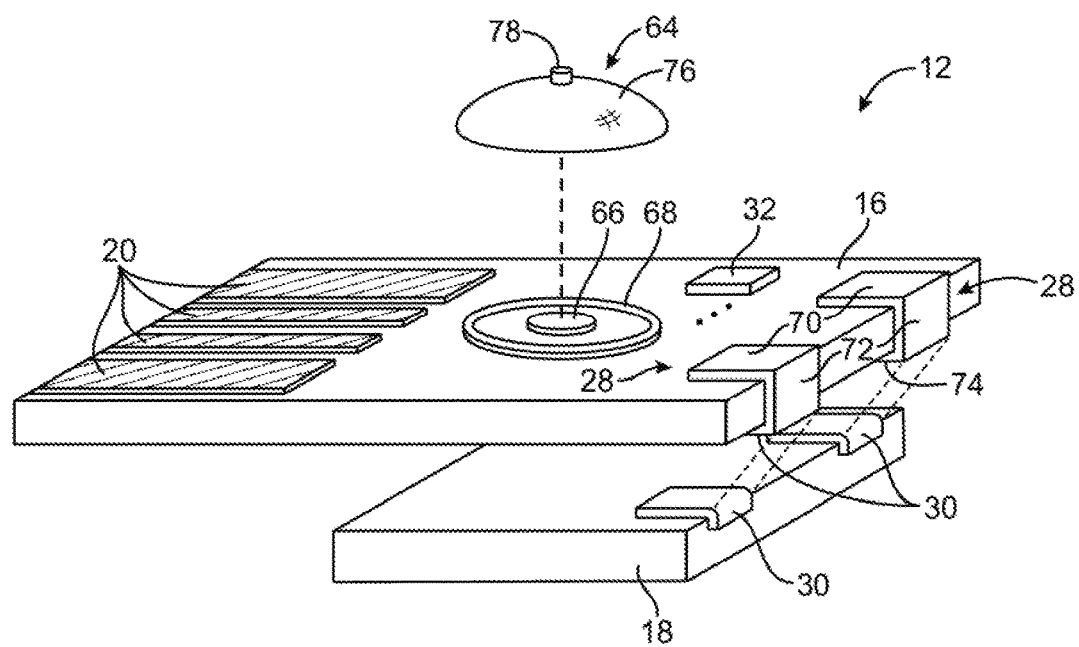
FIG. 5 is an exploded perspective view showing components in an illustrative electronic device in accordance with an embodiment of the present invention.

FIG. 5 is an exploded perspective view showing components in an illustrative configuration for electronic device 12. Buttons (e.g., buttons 34 in FIG. 1) may be formed from switches such as dome switch 64. Dome switch 64 may have a flexible dome-shaped (hemispherical) member 76 and a nub such as nub 78 (e.g., an epoxy nub that improves durability and accurate switch operation). The inner surface of member 76 may be metalized, so that when member 76 is compressed, dome switch contacts 66 and 68 are shorted together. Circuitry in components 32 may detect when switch 64 has been closed in this way and may take appropriate actions. Only one dome switch is shown in FIG. 5, but an electronic device such as a media player may, in general, have one or more buttons, two or more buttons, three or more buttons, four or more buttons, etc.

In the illustrative arrangement of FIG. 5, most or all of the exposed electrical traces on printed circuit board 16 are provided on the upper surface of board 16. For example, contacts 20, switch contacts 66 and 68, and battery leads 28 are all formed from traces on the upper surface of board 16. Upper surface traces are also used to form electrical connections with the contacts of components 32. Battery 18 may be located above terminals 28 or, as shown in FIG. 5, battery 18 may be mounted below printed circuit board 16. To ensure that signals can flow between terminals 30 of battery 18 and terminals 28, terminals 28 may be formed from conformal traces having upper portions 70, edge portions 72, and rear surface portions 74. Solder, welds, conductive adhesive, or other suitable electrical connections may be used to connect terminal portions 74 to terminals 30.

Figure 6:
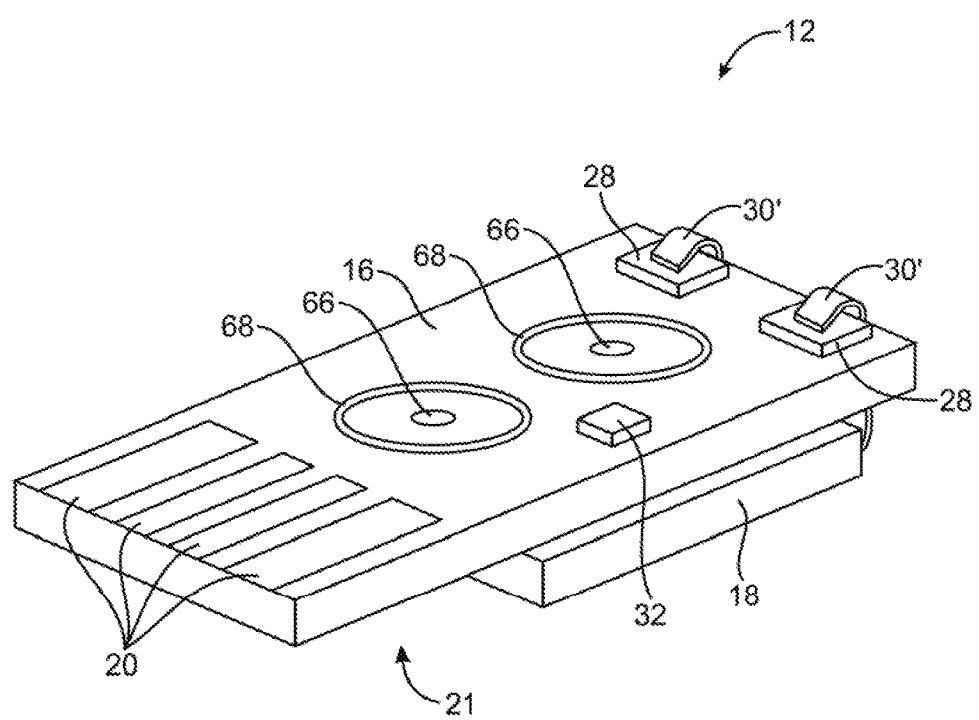
FIG. 6 is a perspective view of an illustrative electronic device before mounting of dome-switches and buttons in accordance with an embodiment of the present invention.

FIG. 6 is a perspective view of device 12 showing how battery contacts 28 may be electrically connected to flexible (non-conformal) battery leads 30'. Leads 30' may be formed as separate bent strips of metal that are connected at one end to pads 28 and at the other end to battery terminals 30 (FIG. 1) or may be formed as part of the battery leads extending from the end of battery 18 (e.g., as part of terminals 30).

Figure 7:
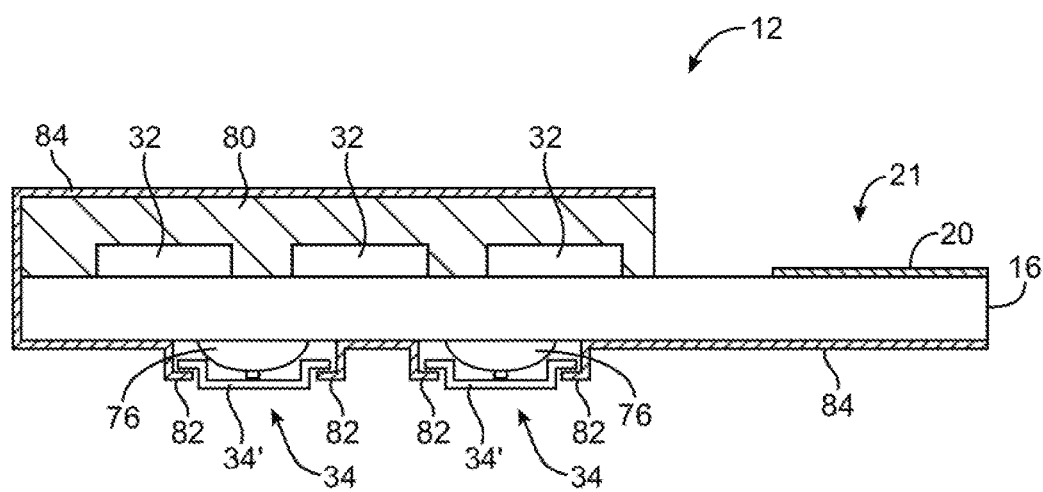
FIG. 7 is a cross-sectional side view of an illustrative electronic device having a thin housing that helps to capture moving button members that are biased against dome switches in accordance with an embodiment of the present invention.

A cross-sectional side view of electronic device 12 showing how device 12 may have a thin housing such as a metal housing shell is shown in FIG. 7. As shown in FIG. 7, components 32 may be encapsulated by encapsulant 80. Encapsulant 80 may be formed from one or more layers of dielectric such as epoxy or other adhesives, plastics (e.g., thermoplastic), glasses, ceramics, mixtures of dielectric and non-dielectric compounds, combinations of these materials, or other suitable materials. Encapsulant 80 may hermetically seal components 32 within device 12 and may help structurally affix components 32 to printed circuit board 16. Contacts 20 may be formed on portion 21 of printed circuit board 16, as described in connection with the example of FIG. 1.

Housing shell 84 may be formed from a metal such as stainless steel or aluminum, or may be formed from other materials (e.g., composites, plastics, etc.) An advantage of using metal to form shell 84 is that metal is relatively strong and may be provided with thin housing walls. Housings such as housing shell structure 84 of FIG. 7 are optional and may be omitted if desired (e.g., to reduce weight).

As shown in FIG. 7, housing 84 may be configured to fit over encapsulant 80. Housing 84 may be provided with an opening into which a pre-encapsulated structure may be inserted. Housing 84 may also be bent into shape over a pre-encapsulated structure. With another suitable arrangement, housing 84 may serve as a cavity for an injection molding process or other process in which encapsulant 80 is introduced into the cavity while printed circuit board 16 is held in place. With this type of approach, encapsulant may be introduced to expand to fill voids between printed circuit board 16 and components 32 and to fill gaps between components 32, board 16, and the inner surfaces of housing walls 84. In a completed device, there may be few air gaps or no air gaps present in the interior of housing 84.

Housing 84 may have portions such as portions 82 that serve as button member retention features. Portions 82 may help hold button member portions 34' of buttons 34 in place above dome switch members 76.

Figure 8:
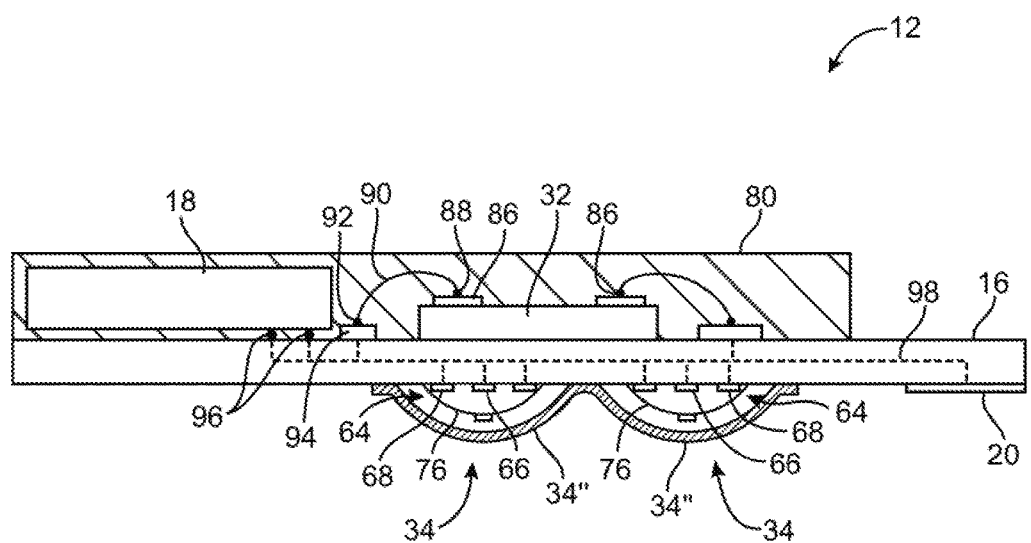
FIG. 8 is a cross-sectional side view of an illustrative electronic device showing how a battery and integrated circuit may be mounted on the opposite side of a substrate from a pair of dome switches and showing how the dome switches may be covered by flexible button structures in accordance with an embodiment of the present invention.

As shown in the illustrative arrangement of FIG. 8, buttons 34 may be formed by placing flexible button members 34" over dome switches 64. Adhesive or other fastening mechanisms may be used to hold flexible member 34" to printed circuit board 16.

Components 32 may be mounted to printed circuit board 16 using any suitable mounting arrangement. In the example of FIG. 8, component 32 has been mounted to printed circuit board 16 using a wire-bonding technique. As shown in FIG. 8, component 32 may have an upper surface on which contact pads 86 are formed. Wire 90 is used to electrically connect contact pads 86 to corresponding contact pads or printed circuit board 16 such as contact pad 94. Wire bonding equipment may form a wire bond at each end of wire 90 (see, e.g., wire bonds 88 and 92 in the FIG. 8 example).

Battery 18 may be electrically connected to board 16 using solder connections 96 or other suitable electrical connections.

Printed circuit board 16 may contain one or more layers. In a typical configuration, printed circuit board 16 contains multiple layers to allow internal traces to cross over each other without shorting to each other. The conductive traces in printed circuit board 16, which are illustrated as traces 98 in FIG. 8, may be used to interconnect contacts 20, components such as component 32, buttons such as buttons 34, battery 18, and other circuits within device 12. Encapsulant 80 may be used to encapsulate components 32 and, if desired, battery 18.

Figure 9:
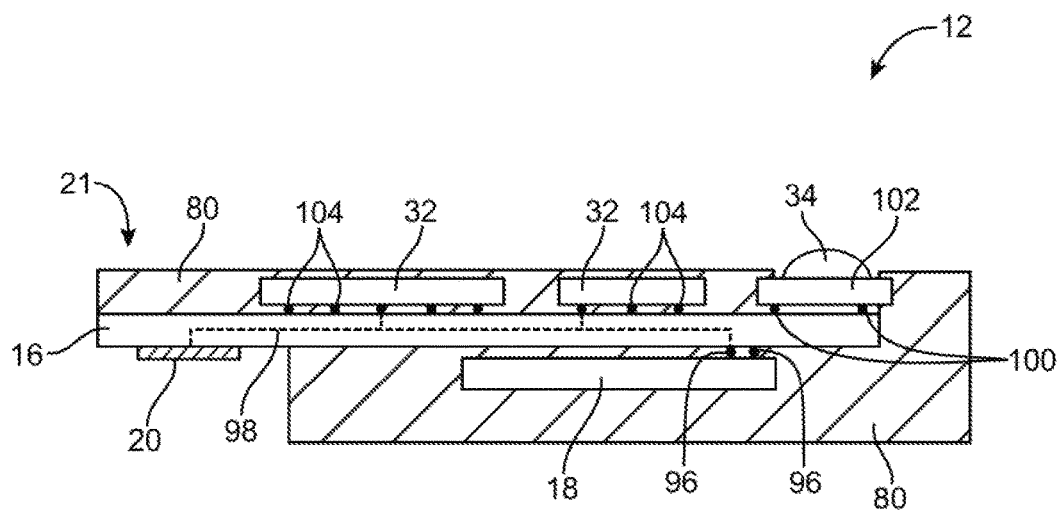
FIG. 9 is a cross-sectional side view of an illustrative electronic device showing how flip-chip mounting techniques may be used to mount integrated circuits directly on a printed circuit board that is encapsulated by an encapsulant that can serve as a device housing in accordance with an embodiment of the present invention.

FIG. 9 is a cross-sectional side view of an illustrative electronic device showing how flip-chip mourning techniques may be used to mount integrated circuits directly on a printed circuit board. As shown in FIG. 9, components such as individual integrated circuit die 32 may be flip-chip mounted to printed. circuit board 16 using solder balls 104. Solder connections 96 may be used to attach battery 18 to the opposite side of printed circuit board 16 (as an example). Button 34 may be attached to printed circuit board 16 using solder 100 or other suitable connections. Encapsulant 80 may be used to encapsulate the flip-chip mounted integrated circuits 32, battery 18 and at least the lower portion of button components such as button 34. In the example of FIG. 9, button 34 has been implemented using a surface-mount button component or other stand-alone button unit that has been soldered to board 16. This is merely illustrative. Buttons in device 12 such as button 34 of FIG. 9 may be formed using any suitable technique (e.g., using flexible button coverings 34" and dome switches 76 of FIG. 8, using button members 34' and housing wall portions 82 of FIG. 7, etc.).

As shown in the arrangements of FIGS. 8 and 9, integrated circuit die may be mounted directly to printed circuit board 16 (e.g., using wire bonds, flip-chip mounting or other ball-grid array techniques, etc.). If desired, some or all of the electrical components in device 12 may be packaged before being mounted on board 16 and encapsulated by encapsulant 80. This type of arrangement is shown in FIG. 10.

Figure 10:
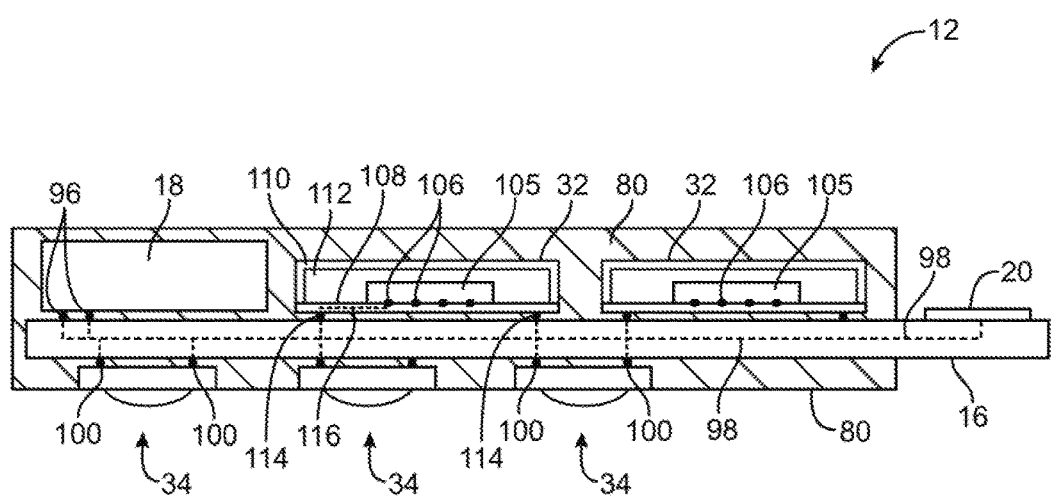
FIG. 10 is a cross-sectional side view of an illustrative electronic device showing how integrated circuits and a battery may be mounted to the opposite side of a printed circuit board from a set of dome-switch buttons and showing how the printed circuit board and components may be encapsulated in an encapsulant that can serve as a device housing in accordance with an embodiment of the present invention.

As shown in FIG. 10, battery 18 may be connected to printed circuit board 16 using solder connections 96. Components 32 in the FIG. 10 example are packaged integrated circuits. In each of these components, a separate integrated circuit die (die 105) is coupled to the interior contacts of the package by interior solder connections 106. Package base 108 and package lid 110 form a package that hermetically seals die 105 from the environment. Encapsulant 112 may fully or partially surround die 105 in the cavity formed by the interior portion of the package to help protect die 105. Traces in each package base 108 (shown as traces 116) may be used to connect solder connections 106 to solder connections 114. Solder connections 114 may be used to connect packaged integrated circuits 32 to printed circuit board 16. Battery 18 may be connected to printed circuit boards 16 using connections 96. Buttons 34 may be connected to the same side or the opposite side of printed circuit board 16 using solder connections 100. Other types of connections ma be used in forming electrical connections in device 12 if desired (e.g., friction-fit contacts such as pin-to-socket connections, spring contacts, welds, contacts formed from conductive adhesive, wire bonds, etc.). The use of solder connections is merely illustrative.

Once desired components have been mounted to printed circuit board 16, encapsulant 80 may be used to cover and thereby encapsulate these components. Encapsulant 80 may, for example, cover both sides of board 16 and all associated components except the exposed button surfaces of buttons 34 and contacts 20, thereby ensuring that the circuitry of integrated circuits 105 and other components will not be affected by changes in humidity, moisture intrusion events, etc.

Figure 11:
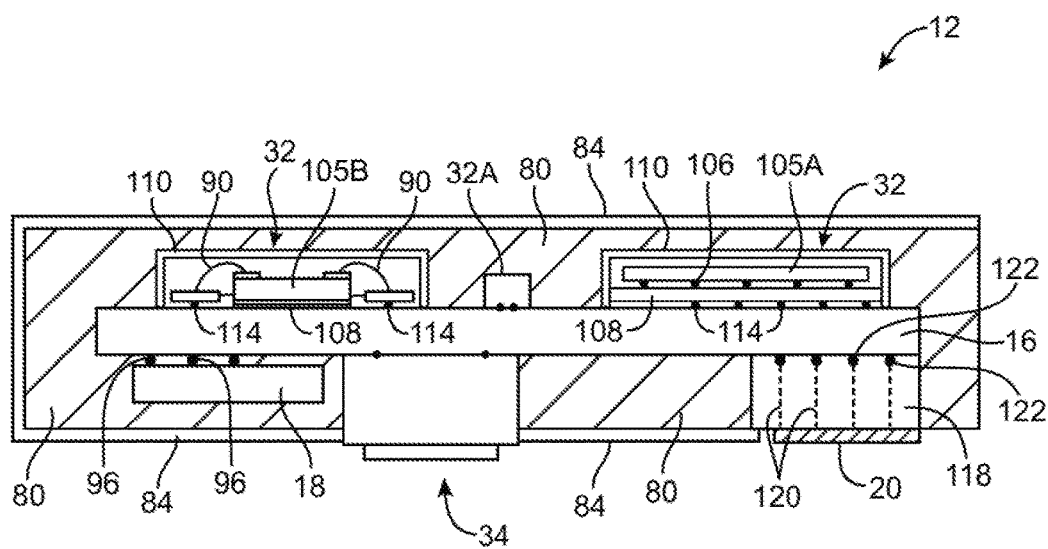
FIG. 11 is a cross-sectional side view of an illustrative electronic device showing how packaged integrated circuits may be mounted on a printed circuit board, covered with an encapsulant, and provided with an optional housing shell in accordance with an embodiment of the present invention.

Another illustrative device configuration is shown in FIG. 11. As shown in FIG. 11, device 12 may include a printed circuit board such as printed circuit hoard 16. Packaged and unpackaged integrated circuits and other components may be attached to printed circuit board 16. For example, packaged integrated circuits such as flip-chip mounted integrated circuit 105A and wire-bond mounted integrated circuit 105B may be mounted to printed circuit board 16. Other components such as component 32A and button 34 may be mounted to printed circuit board 16 on either the top or lower surface of board 16. Battery 18 may be coupled to printed circuit hoard 16 using connections 96.

In the FIG. 11 example, contacts 20 have been provided as part of a connector assembly 118. Connector assembly 118 may be, for example, an off-the-shelf connector such as a USB connector or a separately fabricated connector part that has a plastic housing, solderable leads to attach to printed circuit board 16, and exposed contacts. Connector unit 118 may be mounted on printed circuit board 16 using solder connections 122 or other suitable electrical connections. Once mounted, internal conductors 120 may form electrical connections between each of contacts 20 and solder connections 122. Encapsulant 80 and optional metal housing shell 84 may be formed over the mounted circuitry on board 16.

Figure 12:
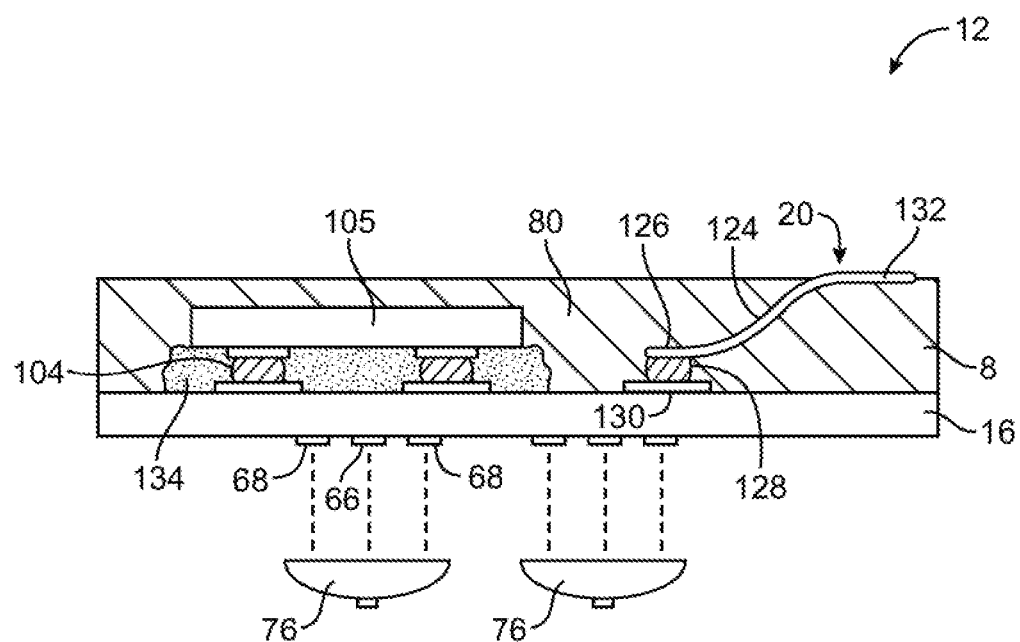
FIG. 12 is a cross-sectional partially exploded side view of an illustrative electronic device showing how contact leads may be embedded in encapsulant in accordance with an embodiment of the present invention.

Another way in which contacts 20 may be formed is shown in the cross-sectional side view of device 12 in FIG. 12. As shown in FIG. 12, device 12 may have contacts 20 that are formed at exposed ends 132 of leads 124. Leads 124 may, for example, be formed from bent strips of metal such as copper, copper plated with gold, etc. Ends 126 of leads 124 may be connected to contact pads such as pad 130 on printed circuit board 16 using solder balls such as solder ball 128. Integrated circuit die 105 may be mounted on printed circuit board 16 using solder balls 104. Underfill 134 (e.g., epoxy or other suitable encapsulant material) may be used to help attach flip-chip mounted integrated circuit 105 directly to board 16 prior to encapsulation of integrated circuit die 105, leads such as lead 124, and other circuitry in device 12 by encapsulant 80. As with all of the illustrative devices 12 that are depicted herein, an optional housing (e.g., a thin metal shell having a wall thickness of 0.5 mm or less, 0.3 mm or less, 0.1 mm or less, or other suitable dimensions) may be used to cover all or some of encapsulant 80.

Components in device 12 may be covered with encapsulant using techniques such as spraying, pad printing, painting with a brush, dipping, dripping, injection molding, combinations of these techniques, or other suitable techniques. With one suitable arrangement, multiple injection molding shots of encapsulant may be incorporated in device 12.

Figure 13:
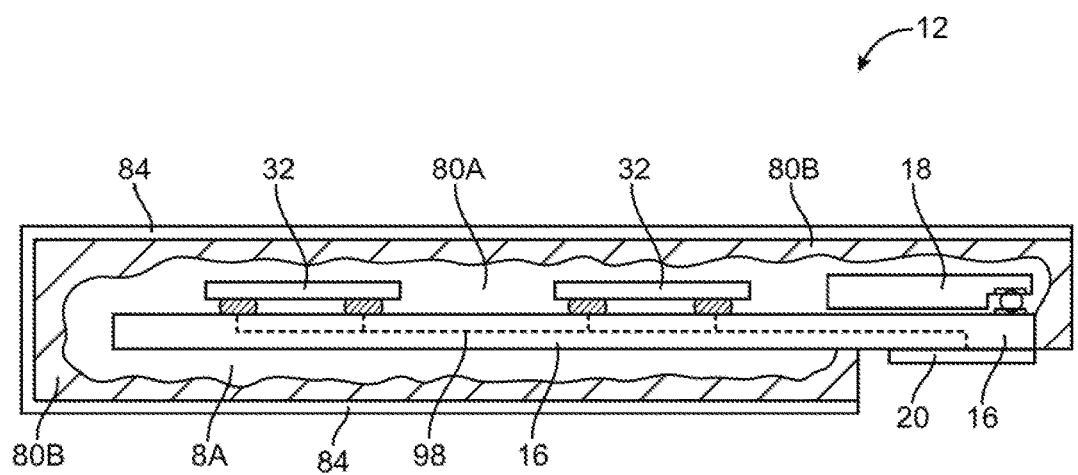
FIG. 13 is a cross-sectional side view of an illustrative electronic device showing how multiple injection molding shots of injection-molded plastic may be used in encapsulating integrated circuits that have been directly mounted to a printed circuit board in a flip-chip configuration in accordance with an embodiment of the present invention.

An illustrative arrangement of this type is shown in FIG. 13. As shown in FIG. 13, printed circuit board 16 may be populated with components 32 such as integrated circuit die that have been directly flip-chip mounted to the surface of board 16, connectors, batteries, leads for forming connectors, buttons, etc. First encapsulation injection molding shot 80A may be used to encapsulate some or all of these connectors. This first injection molding shot of material may, for example, be formed using an injection molding (insert molding) process implemented with an injection molding tool and a first mold. Epoxy or other encapsulant materials may also be used in forming encapsulant structure 80A.

The first layer of encapsulant may be selected for compatibility with components 32, cost, adhesion with board 16, thermal properties, ease of fabrication, etc. Due to shrinkage, materials properties, or other factors, the outer surface of encapsulant 80A may not be of sufficiently high quality to form the outermost surface of a finished device. Accordingly, one or more additional layers of material may be used in encapsulating device 12. As shown in FIG. 13, for example, a second injection molding shot of thermoplastic such as shot 80B or other materials (e.g., epoxy, etc.) may be formed on top of first injection molding shot 80A. Optional housing shell 84 may be formed over second injection molding shot 80B.

If desired, device 12 may contain multiple printed circuit boards. Each of the printed circuit boards may be electrically interconnected and may be encapsulated in a common encapsulation structure (encapsulant 80).

Some or all of printed circuit board 16 may also be omitted from device 12. For example, components can be mounted directly to an integrated circuit die or other non-printed-circuit board substrate with little or no additional printed circuit board support. Encapsulant or other materials can then be included in device 12 to package and strengthen the substrate.

Figure 14:
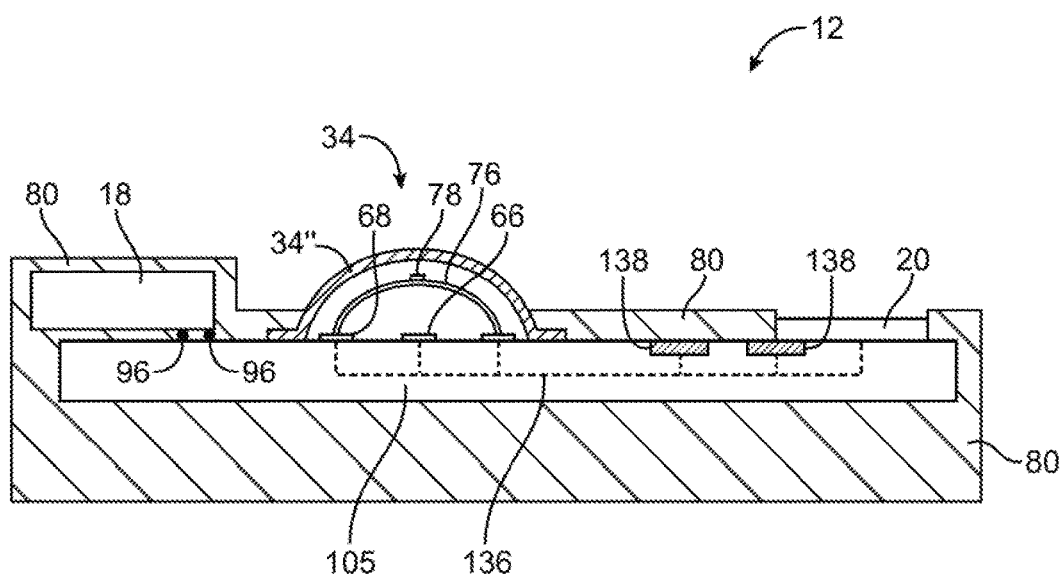
FIG. 14 is a cross-sectional side view of an illustrative electronic device fashioned from a single integrated circuit die on which components such as switches and contacts leads have been formed in accordance with an embodiment of the present invention.

An arrangement of this type is shown in FIG. 14. As shown in FIG. 14, silicon integrated circuit die 105 may contain internal traces 136 (e.g., traces within a dielectric stack on the top layers oldie 105) and may contain circuitry such as circuits 138. Circuits 138 may be bipolar transistor circuits, metal-oxide-semiconductor circuits (e.g., complementary metal-oxide-semiconductor integrated circuits), or other circuitry (e.g., circuitry of the type shown in FIG. 3). Circuitry 138 may be interconnected with external components using contact pads. In the FIG. 14 example, contact pad structures on the surface of integrated circuit die 105 may be used in forming contacts 20. Contacts 20 may, if desired, be thickened using electroplating or other metal deposition techniques. Contact pads may also be used in forming, connections to components such as dome switch 64 in buttons such as button 34. In particular, ring-shaped contact pad 68 may be formed in a circle around dot-shaped contact pad 66. Metallized dome switch member 76 may be mounted above pads 66 and 68 to form a switch for button 34. Button 34 may also have a button member such as member 34" that form an outer surface for the button.

If desired, other components may be mounted to integrated circuit die 105 of FIG. 14. For example, battery 18, additional buttons, contact leads, packaged and unpackaged integrated circuits, discrete components such as capacitors, inductors, and resistors, and other circuitry may be mounted to the surface of integrated circuit chip 105 using contact pads, solder connections, spring-loaded connections, or other suitable electrical connections. Once desired components have been electrically connected to integrated circuit die 105, appropriate portions of these components may be encapsulated with one or more layers of encapsulant 80. When encapsulant 80 has cured and hardened sufficiently, the strength provided by the hardened encapsulant can add structural strength to integrated circuit die 105 that makes die 105 sufficiently strong to use as device 12.

Figure 15:
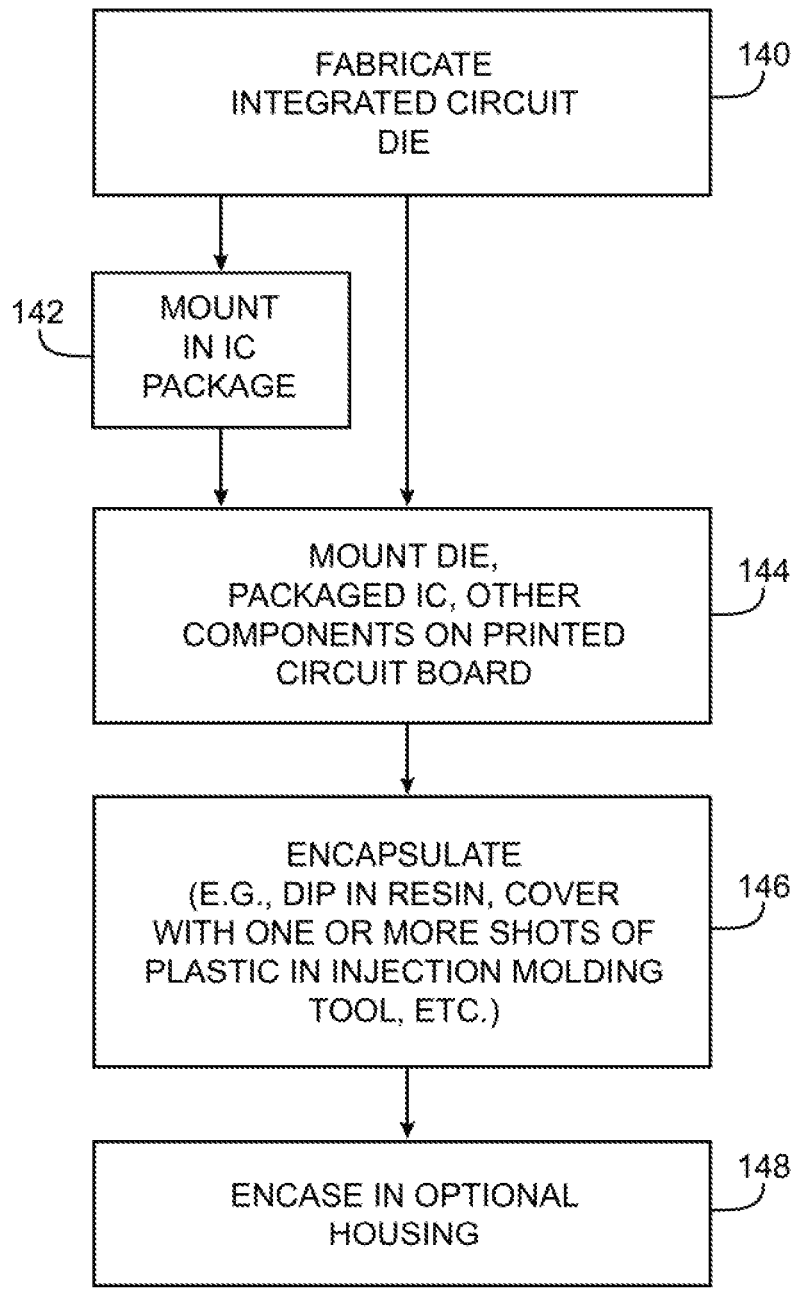
FIG. 15 is a flow chart of illustrative steps involved in forming an electronic device in accordance with an embodiment of the present invention.

Illustrative steps involved in fabricating electronic device 12 are shown in FIG. 15.

At step 140, one or more integrated circuit die such as die 105 may be fabricated using semiconductor processing techniques. During fabrication, contact pads may be formed on the surface of the integrated circuit die.

At step 142, the integrated circuit die may, if desired, be mounted in a package. The package may have ceramic or plastic walls and may include encapsulant, solder balls, wire bonds, etc.

If desired, the packaging operations of step 142 may be omitted (e.g., when it is desired to form device 12 from one or more unpackaged integrated circuit die).

At step 144, electrical components such as buttons, leads, discrete components, and the integrated circuits (packaged or unpackaged) may be mounted to a mounting structure. For example, the integrated circuits and other components may be mounted to a printed circuit board substrate or other substrate that contains metal interconnects. Examples of substrates that may be used for mounting the integrated circuits include plastic mounting structures, rigid printed circuit boards, flex circuits, rigid flex, glass, ceramic, etc. In configurations of the type shown in FIG. 14 in which no printed circuit board is used, components may be attached directly to an integrated circuit die.

After suitable electrical connections have been formed between the integrated circuits and other components, these structures may be fully or partially encapsulated using encapsulant 80. Encapsulant 80 may be formed on the surface of device 12 using dipping, spraying, pad printing, dripping, injection molding, or other suitable techniques. If desired, multiple layers of material may be used to encapsulate components. For example, a first injection molding shot of thermoplastic and/or an epoxy layer may be used as an interior coating, for components. A second injection molding shot of thermoplastic or other material may then be used to form a second or outer encapsulating layer. If desired, additional layer of encapsulant may be formed. Injection molding tools and other fabrication tools may be used in encapsulating the components of device 12. During encapsulation operations, contacts 20 and other such structures are preferably left uncoated with encapsulant. Leaving contacts 20 exposed to the exterior of device 12 allows contacts 20 to be connected to corresponding contacts in a mating device during normal operation.

At step 148 (or as part of step 146), device 12 may be provided with an optional housing such as housing 84 of FIG. 1. Housing 84 may have interior dimensions that exactly or nearly match the exterior dimensions of encapsulant 80. If desired, the encapsulation operations of step 146 may be performed by injecting encapsulant into housing 84 to ensure that interior voids are filled. Housing 84 may also be formed by crimping or otherwise attaching metal pieces to the exterior of the structure formed by cured encapsulant 80.

Because techniques such as these may be used to form structurally sound encapsulation structures, it is not necessary to mount the components of a device in conventional housing structures, thereby potentially saving space and improving device aesthetics. Music players and other electronic devices may be formed using techniques of the type described in connection with FIG. 15.

The foregoing is merely illustrative of the principles of this invention and various modifications can be made by those skilled in the art without departing, from the scope and spirit of the invention.

What is claimed is:

1. A portable electronic device, comprising:
a substrate;
an integrated circuit mounted on the substrate, wherein the integrated circuit includes an audio circuit that produces audio signals;
a battery; and
an encapsulant that encapsulates the integrated circuit, the substrate, and the battery, wherein the encapsulant forms an external surface of the portable electronic device.

2. The portable electronic device defined in claim 1, wherein the substrate is a printed circuit board.

3. The portable electronic device defined in claim 1, wherein the battery is mounted on the substrate.

4. The portable electronic device defined in claim 1, further comprising a user-input component mounted on the substrate.

5. The portable electronic device defined in claim 4, wherein the user-input component is a touch-sensitive component.

6. The portable electronic device defined in claim 1, further comprising input-output port contacts formed on the substrate.

7. The portable electronic device defined in claim 1, further comprising a speaker.

8. The portable electronic device defined in claim 1, wherein the encapsulant forms an additional external surface of the portable electronic device in addition to the external surface of the portable electronic device.

9. The portable electronic device defined in claim 8, wherein the external surface and the additional external surface are orthogonal.

10. The portable electronic device defined in claim 1, wherein the encapsulant has an upper surface between first and second opposing side surfaces, wherein the upper surface forms the external surface of the portable electronic device, wherein the first side surface forms a first additional external surface of the portable electronic device, and wherein the second side surface forms a second additional external surface of the portable electronic device.

11. The portable electronic device defined in claim 10, wherein the substrate has first and second opposing surfaces, wherein the integrated circuit is mounted to the first surface of the substrate, and wherein the second surface of the substrate forms a third additional external surface of the portable electronic device.

12. A portable electronic device having an exterior, comprising:
a substrate;
an integrated circuit mounted on the substrate;
a touch-sensitive component mounted on the substrate; and
an encapsulant that encapsulates the integrated circuit and the substrate without encapsulating the touch-sensitive component, wherein the encapsulant forms an external surface of the portable electronic device and wherein the touch-sensitive component is exposed to the exterior of the portable electronic device.

13. The portable electronic device defined in claim 12, wherein the touch-sensitive component is a button.

14. The portable electronic device defined in claim 12, wherein the integrated circuit includes an audio circuit that produces audio signals.

15. The portable electronic device defined in claim 12, wherein the integrated circuit includes a digital communications circuit that produces digital signals.

* * * * *